United States Patent
Qiu et al.

(10) Patent No.: US 12,406,624 B2
(45) Date of Patent: Sep. 2, 2025

(54) DISPLAY DRIVE CIRCUIT, DISPLAY DRIVE METHOD AND DISPLAY PANEL

(71) Applicants: Chongqing HKC Optoelectronics Technology Co., Ltd., Chongqing (CN); HKC CORPORATION LIMITED, Shenzhen (CN)

(72) Inventors: Bin Qiu, Chongqing (CN); Baohong Kang, Chongqing (CN)

(73) Assignees: Chongqing HKC Optoelectronics Technology Co., Ltd, Chongqing (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/621,066

(22) Filed: Mar. 28, 2024

(65) Prior Publication Data

US 2024/0331633 A1    Oct. 3, 2024

(30) Foreign Application Priority Data

Mar. 28, 2023    (CN) .......................... 202310316418.2

(51) Int. Cl.
*G09G 3/3233*    (2016.01)
*G06F 3/041*    (2006.01)
*G06F 3/044*    (2006.01)
*H10K 59/12*    (2023.01)
*H10K 59/122*    (2023.01)
(Continued)

(52) U.S. Cl.
CPC ......... *G09G 3/3233* (2013.01); *G06F 3/0412* (2013.01); *H10K 59/1201* (2023.02); *H10K 59/122* (2023.02); *H10K 59/40* (2023.02); *H10K 59/80522* (2023.02); *G06F 3/0446* (2019.05); *G06F 2203/04103* (2013.01); *G09G 2310/08* (2013.01); *G09G 2320/0626* (2013.01); *G09G 2320/0693* (2013.01)

(58) Field of Classification Search
CPC ................ H10K 59/40; H10K 59/122; H10K 59/80522; H10K 59/8731; H10K 59/1201; H10K 59/131; H10K 59/873; G06F 3/0412; G06F 3/0446; G06F 2203/04103; G09G 3/3233; G09G 2310/08; G09G 2320/0626; G09G 2320/0693
USPC ...................................................... 345/76, 82
See application file for complete search history.

(56) References Cited

U.S. PATENT DOCUMENTS

2008/0079703 A1    4/2008    Yamagami
2008/0111777 A1    5/2008    Kim
2017/0372677 A1*   12/2017   Chang ..................... H01L 31/16
(Continued)

FOREIGN PATENT DOCUMENTS

CN    101154366 A    4/2008
CN    101923826 A    12/2010
(Continued)

*Primary Examiner* — Jimmy H Nguyen
(74) *Attorney, Agent, or Firm* — Franklin & Associates International Inc; Matthew F. Lambrinos

(57) ABSTRACT

Disclosed are a display drive circuit, a display drive method and a display panel. This solution adjusts enabling time of a first drive unit and a second drive unit based on light-emitting brightness of a first display unit and light-emitting brightness of a second display unit which are detected by a display detection unit, and the service lives of the first display unit and the second display unit are effectively prolonged.

12 Claims, 5 Drawing Sheets

(51) Int. Cl.
*H10K 59/40* (2023.01)
*H10K 59/80* (2023.01)

(56) References Cited

U.S. PATENT DOCUMENTS

| | | | |
|---|---|---|---|
| 2020/0211463 A1* | 7/2020 | Yue | G09G 3/3258 |
| 2021/0358401 A1 | 11/2021 | Liu | |
| 2022/0036850 A1 | 2/2022 | Wang et al. | |

FOREIGN PATENT DOCUMENTS

| | | |
|---|---|---|
| CN | 102054436 A | 5/2011 |
| CN | 103985354 A | 8/2014 |
| CN | 207781150 U | 8/2018 |
| CN | 110767160 A | 2/2020 |
| CN | 111883081 A | 11/2020 |
| CN | 115132132 A | 9/2022 |
| JP | 2008122836 A | 5/2008 |

* cited by examiner

DISPLAY DRIVE CIRCUIT, DISPLAY DRIVE METHOD AND DISPLAY PANEL

CROSS REFERENCE TO RELATED APPLICATIONS

The present application claims priority to the invention patent No. 202310316418.2, entitled "Display Drive Circuit, Display Drive Method and Display Panel", filed to the China National Intellectual Property Administration on Mar. 28, 2023, the entire content of which is incorporated herein by reference.

TECHNICAL FIELD

The present application generally relates to the technical field of display panels, in particular to a display drive circuit, a display drive method and a display panel.

BACKGROUND

Light-emitting diode (LED) displays are favored by consumers due to their less weight, higher brightness, lower power consumption, faster response, higher contrast, wider color gamut and wider viewing angle compared to liquid crystal displays (LCDs). With the rapid development of an LED display technology, organic light emitting diodes (OLEDs) gradually enter consumers' life. OLED display devices are widely recognized as the mainstream technology for next-generation display due to their excellent characteristics such as self illumination, no need for a backlight source, high contrast, less thickness, wide viewing angle, fast response speed, and the ability to be used for flexible panels, curved panels, etc., and have been favored by major display manufactures.

OLED display units are controlled by thin-film-transistors (TFTs) to emit light. As time goes on, due to long-time lighting and material aging, the OLED display units are prone to causing material decay, resulting in color deviation, screen burning and other issues of the OLED display units after a period of time, which affects the display effect.

SUMMARY

In a first aspect, the present application provides a display drive circuit, including: a first drive unit, a second drive unit, a display detection unit and a control unit; wherein, the control unit is connected with the first drive unit and the second drive unit respectively, and used for sending a data signal to the first drive unit and the second drive unit alternately; the first drive unit is connected with a first display unit, and used for driving the first display unit to emit light according to the data signal; the second drive unit is connected with a second display unit, and used for driving the second display unit to emit light according to the data signal; and the display detection unit is connected with the control unit, and used for detecting light-emitting brightness of the first display unit and the second display unit, and transmitting the light-emitting brightness of the first display unit and the second display unit to the control unit, and the control unit is used for adjusting enabling time of the first drive unit and the second drive unit according to the received light-emitting brightness.

In a second aspect, the present application further provides a display drive method, applied to a display drive circuit. The display drive circuit includes: a first drive unit, a second drive unit, a display detection unit and a control unit; wherein, the control unit is connected with the first drive unit and the second drive unit respectively, and used for sending a data signal to the first drive unit and the second drive unit alternately; the first drive unit is connected with a first display unit, and used for driving the first display unit to emit light according to the data signal; the second drive unit is connected with a second display unit, and used for driving the second display unit to emit light according to the data signal; and the display detection unit is connected with the control unit, and used for detecting light-emitting brightness of the first display unit and the second display unit, and transmitting the light-emitting brightness of the first display unit and the second display unit to the control unit, and the control unit is used for adjusting enabling time of the first drive unit and the second drive unit according to the received light-emitting brightness.

The display drive method includes:
sending the data signal to the first drive unit and the second drive unit alternately through the control unit, wherein the first drive unit is used for driving the first display unit to emit light according to the data signal, and the second drive unit is used for driving the second display unit to emit light according to the data signal; and
detecting the light-emitting brightness of the first display unit and the second display unit through the display detection unit, and transmitting the light-emitting brightness of the first display unit and the second display unit to the control unit, such that the control unit adjusts enabling time of the first drive unit and the second drive unit according to the received light-emitting brightness.

In a third aspect, the present application further provides a display panel, including a plurality of pixels arranged in an array, each pixel is connected with a corresponding drive circuit, and at least part of the drive circuits is, for example, a display drive circuit. The display drive circuit includes: a first drive unit, a second drive unit, a display detection unit and a control unit; wherein, the control unit is connected with the first drive unit and the second drive unit respectively, and used for sending a data signal to the first drive unit and the second drive unit alternately; the first drive unit is connected with a first display unit, and used for driving the first display unit to emit light according to the data signal; the second drive unit is connected with a second display unit, and used for driving the second display unit to emit light according to the data signal; and the display detection unit is connected with the control unit, and used for detecting light-emitting brightness of the first display unit and the second display unit, and transmitting the light-emitting brightness of the first display unit and the second display unit to the control unit, and the control unit is used for adjusting enabling time of the first drive unit and the second drive unit according to the received light-emitting brightness.

The display drive circuit provided by an embodiment of the present application includes: the first drive unit, the second drive unit, the display detection unit and the control unit. The control unit is connected with the first drive unit and the second drive unit respectively, and used for sending the data signal to the first drive unit and the second drive unit alternately; the first drive unit is connected with the first display unit, and used for driving the first display unit to emit light according to the data signal; the second drive unit is connected with the second display unit, and used for driving the second display unit to emit light according to the data signal; the display detection unit is connected with the control unit, and used for detecting light-emitting brightness of the first display unit and the second display unit, and transmitting the light-emitting brightness of the first display unit and the second display unit to the control unit, and the control unit is used for adjusting the enabling time of the first drive unit and the second drive unit according to the received light-emitting brightness. When the first drive unit is enabled, the second drive unit is not enabled, when the second drive unit is enabled, the first drive unit is not enabled, when the first drive unit is enabled, the first display unit is driven to emit light, and when the second drive unit is enabled, the second display unit is driven to emit light, which achieves that within any period of time, there is only one of the first drive unit and the second drive unit being in an enabled state, thereby achieving alternate display of the first display unit and the second display unit, reducing a display duration of the first display unit and the second display unit, and avoiding the problem that the first display unit or the second display unit emits light for displaying for a long time, so that the service lives of the first display unit and the second display unit are effectively prolonged. At the same time, the enabling time of the first drive unit and the second drive unit is adjusted based on the light-emitting brightness of the first display unit and the light-emitting brightness of the second display unit which are detected by the display detection unit, which further effectively prolongs the service lives of the first display unit and the second display unit, and makes display effects of the first drive unit and the second drive unit tend to be the same, improving the display effects.

DESCRIPTION OF REFERENCE NUMERALS

1—first drive unit; 2—second drive unit; 3—display detection unit; 31—first display detection circuit; 32—second display detection circuit; 4—control unit; 41—control switch; 5—first display unit; 6—second display unit; 7—pixel; 8—display drive circuit; M1—first thin-film—transistor; M2—second thin-film-transistor; Q1—first control switch; Q2—second control switch; Lc—switching circuit signal; Sn—scanning signal; Dm—data signal; and Ics—constant current source.

DETAILED DESCRIPTION

In order to describe technical solutions of embodiments of the present application more clearly, specific implementations of the present application will be described below with reference to accompanying drawings. Obviously, the accompanying drawings described below are only some embodiments of the present application. For those ordinarily skilled in the art, other accompanying drawings and other implementations can be further obtained based on these accompanying drawings without creative labor.

In order to make the drawings concise, only the parts related to the present application are schematically represented in each figure, and they do not represent actual structures of products. In addition, in order to make the drawings concise and easy to understand, in some figures, only one of components with the same structure or function is schematically drawn or marked. In this article, "one" not only represents "only this one", but also can refer to a situation of "multiple ones".

The present application will be further described in detail below in conjunction with the accompanying drawings and embodiments.

One Embodiment

Figure 1:
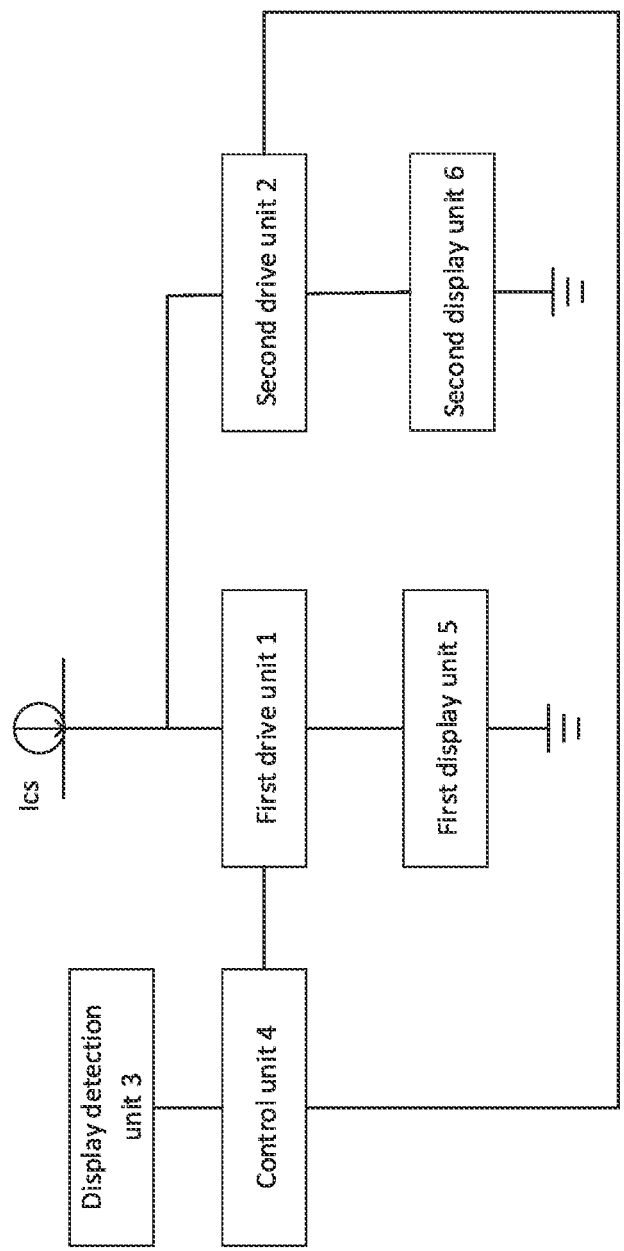
FIG. 1 is a basic schematic structural diagram of a display drive circuit provided by one embodiment of the present application.

Please refer to FIG. 1, which is a display drive circuit provided by the embodiment of the present application. As shown in FIG. 1, the display drive circuit includes: a first drive unit 1, a second drive unit 2, a display detection unit 3 and a control unit 4; wherein, the control unit 4 is connected with the first drive unit 1 and the second drive unit 2 respectively, and used for sending a data signal Dm to the first drive unit 1 and the second drive unit 2 alternately; the first drive unit 1 is connected with a first display unit 5, and used for driving the first display unit 5 to emit light according to the data signal Dm; the second drive unit 2 is connected with a second display unit 6, and used for driving the second display unit 6 to emit light according to the data signal Dm; and the display detection unit 3 is connected with the control unit 4, and used for detecting light-emitting brightness of the first display unit 5 and the second display unit 6, and transmitting the light-emitting brightness of the first display unit 5 and the second display unit 6 to the control unit 4, and the control unit 4 is used for adjusting enabling time of the first drive unit 1 and the second drive unit 2 according to the received light-emitting brightness.

Figure 10:
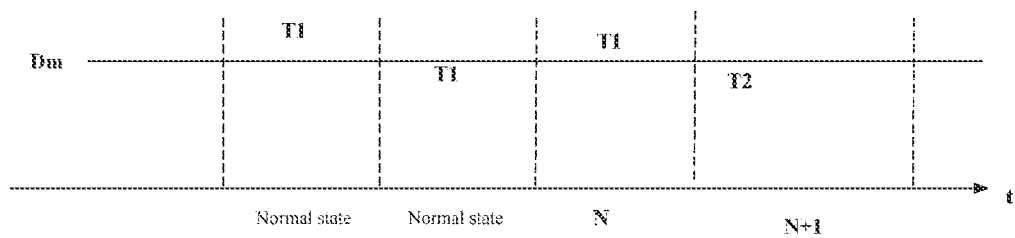
FIG. 10 is a basic schematic diagram of timing of each signal in another optional display drive circuit provided by another embodiment of the present application.

It can be understood that the control unit 4 is connected with the first drive unit 1 and the second drive unit 2 respectively, and used for sending the data signal Dm to the first drive unit 1 and the second drive unit 2 alternately, and the drive units are enabled when receiving the data signal Dm, that is, the first drive unit 1 and the second drive unit 2 are in an enabled state alternately. Specifically, for example, As shown in FIG. 10. when at an $N^{th}$ frame(Ta), the control unit 4 sends the data signal Dm to the first drive unit 1, then the first drive unit 1 is enabled at the Ni frame, and the second drive unit 2 does not receive the data signal Dm and is not enabled; the control unit 4 sends the data signal Dm to the second drive unit 2 at an $(N+1)^{th}$ frame(Tb), then the second drive unit 2 is enabled at the $(N+1)^{th}$ frame, and the first drive unit 1 does not receive the data signal Dm and is not enabled; and the control unit 4 sends the data signal Dm to the first drive unit 1 at an $(N+2)^{th}$ frame(Ta), then the first drive unit 1 is enabled at the $(N+2)^{th}$ frame, and the second drive unit 2 does not receive the data signal Dm and is not enabled . . . , and so on, so that when the first drive unit 1 is enabled, the second drive unit 2 is not enabled, and when the second drive unit 2 is enabled, the first drive unit 1 is not enabled. When the first drive unit 1 is enabled, the first display unit 5 is driven to emit light, the second drive unit 2 is not enabled, and the second display unit 6 does not emit light. Similarly, when the second drive unit 2 is enabled, the second display unit 6 is driven to emit light, the first drive unit 1 is not enabled, and the first display unit 5 does not emit light, which achieves that within any period of time, there is only one of the first drive unit 1 and the second drive unit 2 being in the enabled state, thereby achieving alternate display of the first display unit 5 and the second display unit 6, reducing a display duration of the first display unit 5 and the second display unit 6, and avoiding the problem that the first display unit 5 or the second display unit 6 emits light for displaying for a long time, so that the service lives of the first display unit 5 and the second display unit 6 are effectively prolonged.

It can be understood that this embodiment does not limit the alternate display of the first display unit 5 and the second display unit 6 in a unit of frame, and relevant personnel may flexibly set an interval display duration of the first display unit 5 and the second display unit 6, for example, the control unit 4 sends the data signal Dm alternately in a unit of two frames. Specifically, for example, when at an Ni frame, the control unit 4 sends the data signal Dm to the first drive unit 1, then the first drive unit 1 is enabled at the $N^{th}$ frame, and the second drive unit 2 does not receive the data signal Dm and is not enabled; the control unit 4 sends the data signal Dm to the first drive unit 1 at an $(N+1)^{th}$ frame, then the first drive unit 1 is enabled at the $(N+1)^{th}$ frame, and the second drive unit 2 does not receive the data signal Dm and is not enabled; the control unit 4 sends the data signal Dm to the second drive unit 2 at an $(N+2)^{th}$ frame, then the second drive unit 2 is enabled at the $(N+2)^{th}$ frame, and the first drive unit 1 does not receive the data signal Dm and is not enabled; the control unit 4 sends the data signal Dm to the second drive unit 2 at an $(N+3)^{th}$ frame, then the second drive unit 2 is enabled at the $(N+3)^{th}$ frame, and the first drive unit 1 does not receive the data signal Dm and is not enabled; and the control unit 4 sends the data signal Dm to the first drive unit 1 at an $(N+4)^{th}$ frame, then the first drive unit 1 is enabled at the $(N+4)^{th}$ frame, and the second drive unit 2 does not receive the data signal Dm and is not enabled . . . , and so on.

Further, the display drive circuit provided by this example further includes the display detection unit 3, the display detection unit 3 is connected with the control unit 4, and used for detecting the light-emitting brightness of the first display unit 5 and the second display unit 6, and transmitting the light-emitting brightness of the first display unit 5 and the second display unit 6 to the control unit 4, and the control unit 4 is used for adjusting the enabling time of the first drive unit 1 and the second drive unit 2 according to the received light-emitting brightness, so as to modify and adjust an enabling duration of the first drive unit 1 and/or the second drive unit 2.

Specifically, due to various factors such as processes, design and materials, the aging degree and light-emitting efficiency of the first display unit 5 and the second display unit 6 are different, at this time, the first display unit 5 and the second display unit 6 work alternately with the same display duration, and the display effect of the display unit with the higher aging degree will deteriorate rapidly, resulting in a larger and larger display difference between the two display units, thereby affecting the display effect. In order to avoid the above situation, this example provides the display detection unit 3, when the first drive unit 1 is enabled to drive the first display unit 5 to emit light, the light-emitting brightness of the first display unit 5 is detected through the display detection unit 3, when the second drive unit 2 is enabled to drive the second display unit 6 to emit light, the light-emitting brightness of the second display unit 6 is detected through the display detection unit 3, and finally, the enabling time of the first drive unit 1 and the second drive unit 2 is adjusted based on the light-emitting brightness of the first display unit 5 and the light-emitting brightness of the second display unit 6 which are detected by the display detection unit 3.

Figure 9:
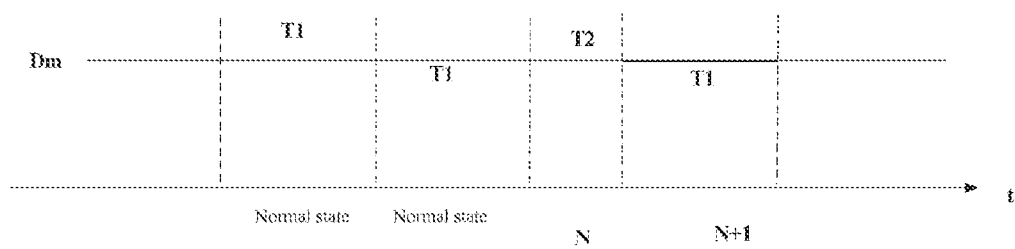
FIG. 9 is a basic schematic diagram of timing of each signal in another optional display drive circuit provided by another embodiment of the present application.

Continuing from the above example, if the light-emitting brightness of the first display unit 5 is higher than the light-emitting brightness of the second display unit 6, the control unit 4 may reduce a duration of the data signal Dm corresponding to the first display unit 5, or increase a duration of the data signal Dm corresponding to the second display unit 6, which adjusts the enabling time of the first drive unit 1 and the second drive unit 2. Specifically, for example, as shown in FIG. 9, in a normal state, the durations of the data signals Dm received by the first drive unit 1 and the second drive unit 2 are both T1, when at the $N^{th}$ frame, the control unit 4 sends the data signal Dm with a duration T2 to the first drive unit 1, and when at the $(N+1)^{th}$ frame, the control unit 4 sends the data signal Dm with the duration T1 to the second drive unit 2, wherein T2 is smaller than T1, so as to reduce the duration of the data signal Dm corresponding to the first display unit 5, and thus the display effects of the first display unit 5 and the second display unit 6 tend to be the same. For another example, as shown in FIG. 10, in the normal state, the duration of each data signal Dm is T1, when at the $N^{th}$ frame, the control unit 4 sends the data signal Dm with the duration T1 to the first drive unit 1, and when at the $(N+1)^{th}$ frame, the control unit 4 sends the data signal Dm with the duration T2 to the second drive unit 2, wherein T2 is greater than T1, so as to increase the duration of the data signal Dm corresponding to the second display unit 6, and thus the display effects of the first display unit 5 and the second display unit 6 tend to be the same.

It can be understood that similarly, if the light-emitting brightness of the second display unit 6 is higher than the light-emitting brightness of the first display unit 5, the control unit 4 may reduce the duration of the data signal Dm corresponding to the second display unit 6, or increase the duration of the data signal Dm corresponding to the first display unit 5, which will not be repeated here.

It can be understood that after the display detection unit 3 detects the light-emitting brightness of the first display unit 5 and the second display unit 6 and transmits the light-emitting brightness of the first display unit 5 and the second display unit 6 to the control unit 4, the control unit can further modify an alternating cycle of the data signal Dm (Ta or Tb), so that the light-emitting efficiency of the first display unit 5 and the second display unit 6 tends to be consistent. Specifically, if when the control unit 4 sends the data signal Dm alternately with a current alternating cycle, the light-emitting brightness of the first display unit 5 is greater than the light-emitting brightness of the second display unit 6, at this time, a light-emitting cycle (t2) of the second display unit 6 may be shortened, and a light-emitting cycle (t1) of the first display unit 5 may be prolonged. For example, the control unit 4 sends the data signal Dm alternately to the first drive unit 1 and the second drive unit 2 with one frame as the alternating cycle, the light-emitting brightness of the first display unit 5 is greater than the light-emitting brightness of the second display unit 6, and the control unit 4 modifies the alternating cycle to be "successively sending the data signal Dm twice to the first drive unit 1, and then switching to send the data signal Dm once to the second drive unit 2". Specifically, when at an $N^{th}$ frame, the control unit 4 sends the data signal Dm to the first drive unit 1, then the first drive unit 1 is enabled at the $N^{th}$ frame, and the second drive unit 2 does not receive the data signal Dm and is not enabled; the control unit 4 sends the data signal Dm to the first drive unit 1 at an $(N+1)^{th}$ frame, then the first drive unit 1 is enabled at the $(N+1)^{th}$ frame, and the second drive unit 2 does not receive the data signal Dm and is not enabled; the control unit 4 sends the data signal Dm to the second drive unit 2 at an $(N+2)^{th}$ frame, then the second drive unit 2 is enabled at the $(N+2)^{th}$ frame, and the first drive unit 1 does not receive the data signal Dm and is not enabled; and the control unit 4 sends the data signal Dm to the first drive unit 1 at an $(N+3)^{th}$ frame, then the first drive unit 1 is enabled at the $(N+3)^{th}$ frame, and the second drive unit 2 does not receive the data signal Dm and is not enabled . . . , and so on, so that an enabling duration of the first display unit 5 is longer than an enabling duration of the second display unit 6, thereby increasing an aging speed of the first display unit 5, and thus the aging degrees of the first display unit 5 and the second display unit 6 tend to be consistent.

Figure 2:
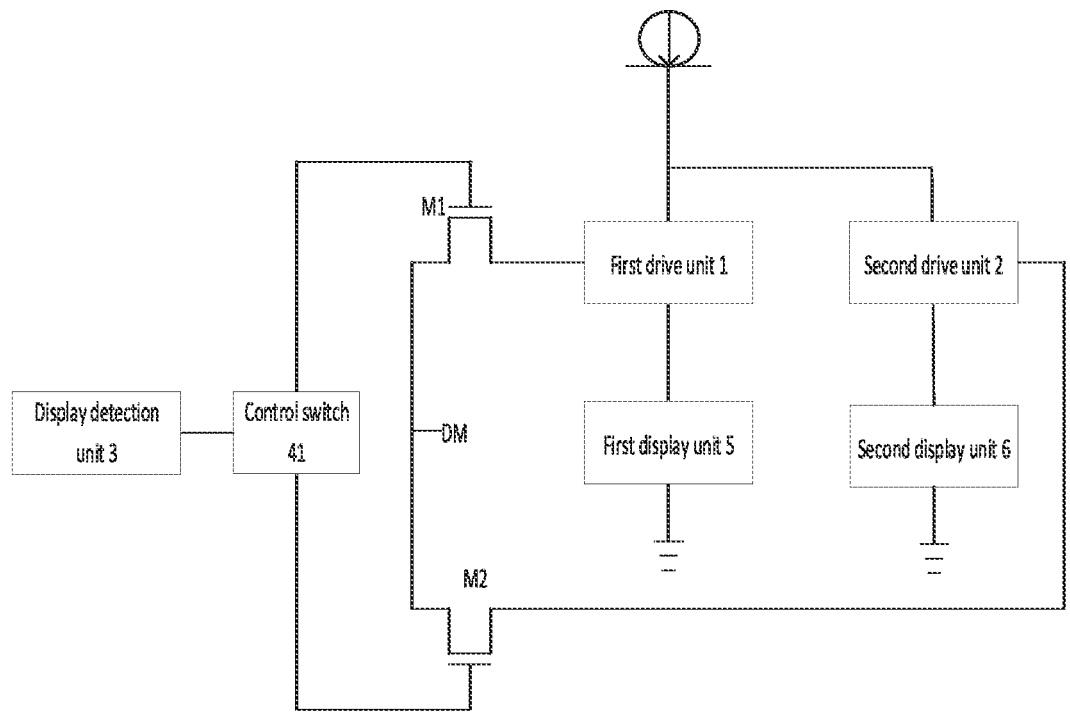
FIG. 2 is a basic schematic structural diagram of an optional display drive circuit provided by one embodiment of the present application.

In some examples of this embodiment, as shown in FIG. 2, the control unit 4 includes: a first thin-film-transistor M1, a second thin-film-transistor M2 and a control switch; the data signal Dm is connected into an input end of the first thin-film-transistor M1, the first drive unit 1 is connected into an output end of the first thin-film-transistor M1, and the control switch is connected into a control end of the first thin-film-transistor M1; and the data signal Dm is connected into an input end of the second thin-film-transistor M2, the second drive unit 2 is connected into an output end of the second thin-film-transistor M2, and the control switch is connected into a control end of the second thin-film-transistor M2. The control switch alternately turns on the first thin-film-transistor M1 and the second thin-film-transistor M2, and when the first thin-film-transistor M1 is turned on, the first thin-film-transistor M1 transmits the data signal Dm to the first drive unit 1, and thus the first drive unit 1 is enabled; and when the second thin-film-transistor M2 is turned on, the second thin-film-transistor M2 transmits the data signal Dm to the second drive unit 2, and thus the second drive unit 2 is enabled. When the first drive unit 1 is enabled, the first display unit 5 is driven to emit light, the second drive unit 2 is not enabled, and the second display unit 6 does not emit light. Similarly, when the second drive unit 2 is enabled, the second display unit 6 is driven to emit light, the first drive unit 1 is not enabled, and the first display unit 5 does not emit light, which achieves that within any period of time, there is only one of the first drive unit 1 and the second drive unit 2 being in the enabled state, thereby achieving alternate display of the first display unit 5 and the second display unit 6, reducing a display duration of the first display unit 5 and the second display unit 6, and avoiding the problem that the first display unit 5 or the second display unit 6 emits light for displaying for a long time, so that the service lives of the first display unit 5 and the second display unit 6 are effectively prolonged.

Continuing from the above example, specifically, for example, when at an Ni frame, the control switch turns on the first thin-film-transistor M1, the data signal Dm is sent to the first drive unit 1 through the first thin-film-transistor M1, then the first drive unit 1 is enabled at the $N^{th}$ frame, and the second drive unit 2 does not receive the data signal Dm and is not enabled; the second thin-film-transistor M2 is turned on at an $(N+1)^{th}$ frame, the data signal Dm is sent to the second drive unit 2 through the second thin-film-transistor M2, then the second drive unit 2 is enabled at the $(N+1)^{th}$ frame, and the first drive unit 1 does not receive the data signal Dm and is not enabled; and the first thin-film-transistor M1 is turned on at an $(N+2)^{th}$ frame, the data signal Dm is sent to the first drive unit 1 through the first thin-film-transistor M1, then the first drive unit 1 is enabled at the $(N+2)^{th}$ frame, and the second drive unit 2 does not receive the data signal Dm and is not enabled . . . , and so on.

It can be understood that this embodiment does not limit the type of the thin-film-transistors, each thin-film-transistor described in this embodiment may be a P-type thin-film-transistor (P-type TFT) or an N-type thin-film-transistor (N-type TFT). At the same time, the thin-film-transistors provided by this embodiment may be made by using a thin-film-transistor (TFT) process technology of low-temperature polycrystalline silicon (LTPS), amorphous silicon (a-Si), or amorphous indium gallium zinc oxide (a-IGZO), but is not limited to this.

Figure 3:
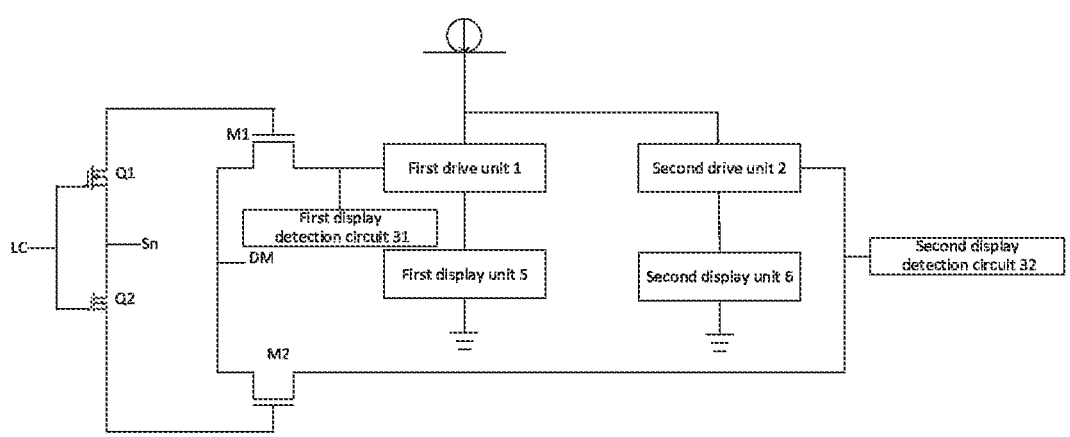
FIG. 3 is a basic schematic structural diagram of another optional display drive circuit provided by one embodiment of the present application.
Figure 5:
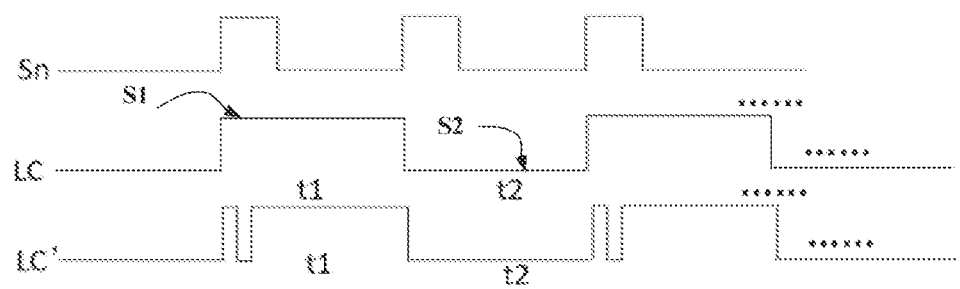
FIG. 5 is a basic schematic diagram of timing of each signal in an optional display drive circuit provided by another embodiment of the present application.

In some examples of this embodiment, as shown in FIG. 3 and FIG. 5, the control switch includes: a first control switch Q1 and a second control switch Q2, the first control switch Q1 is turned on when receiving a first polarity signal S1, the second control switch Q2 is turned on when receiving a second polarity signal S2, and the first polarity signal and the second polarity signal are opposite-polarity signals. A switching circuit signal LC is connected into a control end of the first control switch Q1, a scanning signal Sn is connected into an input end of the first control switch Q1, and an output end of the first control switch Q1 is connected with the control end of the first thin-film-transistor M1; and the switching circuit signal LC is connected into a control end of the second control switch Q2, the scanning signal Sn is connected into an input end of the second control switch Q2, and an output end of the second control switch Q2 is connected with the control end of the second thin-film-transistor M2. The switching circuit signal LC is connected into the control ends of the first control switch Q1 and the second control switch Q2 respectively, when the switching circuit signal LC is the first polarity signal, the first control switch Q1 is turned on, and the second control switch Q2 is cut off, and when the switching circuit signal LC is the second polarity signal, the second control switch Q2 is turned on, and the first control switch Q1 is cut off. When the first control switch Q1 is turned on, the first control switch Q1 transmits the scanning signal Sn to the control end of the first thin-film-transistor M1, so as to turn on the first thin-film-transistor M1; and when the second control switch Q2 is turned on, the second control switch Q2 transmits the scanning signal Sn to the control end of the second thin-film-transistor M2, so as to turn on the second thin-film-transistor M2, and the first control switch Q1 and the second control switch Q2 transmit the scanning signal Sn to the first thin-film-transistor M1 and the second thin-film-transistor M2 by turns, so that alternate conducting of the first thin-film-transistor M1 and the second thin-film-transistor M2 is achieved.

Continuing from the above example, specifically, for example, when at an $N^{th}$ frame, the switching circuit signal LC is the first polarity signal, at this time, the switching circuit signal LC turns on the first thin-film-transistor M1, the first thin-film-transistor M1 sends the data signal Dm to the first drive unit 1, then the first drive unit 1 is enabled at the $N^{th}$ frame, and the second drive unit 2 does not receive the data signal Dm and is not enabled; the switching circuit signal LC is the second polarity signal at an $(N+1)^{th}$ frame, at this time, the switching circuit signal LC turns on the second thin-film-transistor M2, the second thin-film-transistor M2 sends the data signal Dm to the second drive unit 2, then the second drive unit 2 is enabled at the $(N+1)^{th}$ frame, and the first drive unit 1 does not receive the data signal Dm and is not enabled; and the switching circuit signal LC is the first polarity signal at an $(N+2)^{th}$ frame, at this time, the switching circuit signal LC turns on the first thin-film-transistor M1, the first thin-film-transistor M1 sends the data signal Dm to the first drive unit 1, then the first drive unit 1 is enabled at the $(N+2)^{th}$ frame, and the second drive unit 2 does not receive the data signal Dm and is not enabled . . . , and so on.

In some examples of this embodiment, as shown in FIG. 3, the display detection unit 3 includes: a first display detection circuit 31 and a second display detection circuit 32, and the first display detection circuit 31 and the second display detection circuit 32 are connected with the control unit 4 respectively; the first display detection circuit 31 is used for detecting the light-emitting brightness of the first display unit 5, and the second display detection circuit 32 is used for detecting the light-emitting brightness of the second display unit 6; and the control unit 4 is used for adjusting the data signal Dm according to the light-emitting brightness of the first display unit 5 and the light-emitting brightness of the second display unit 6. The first display detection circuit 31 is arranged around the first display unit 5, and used for detecting the light-emitting brightness of the first display unit 5 during light emitting, and converting the light-emitting brightness into a corresponding electrical signal to be transmitted to the control unit 4; and the second display detection circuit 32 is arranged around the second display unit 6, and used for detecting the light-emitting brightness of the second display unit 6 during light emitting, and converting the light-emitting brightness into a corresponding electrical signal to be transmitted to the control unit 4, and the control unit 4 is used for adjusting the switching circuit signal LC according to the light-emitting brightness of the first display unit 5 during light emitting and the light-emitting brightness of the second display unit 6 during light emitting, so as to adjust the enabling time of the first drive unit 1 and the second drive unit 2.

Continuing from the above example, for example, in a normal state, each switching circuit signal LC has a duration T1, the control unit 4 transmits the switching circuit signal LC with the duration T1 to the first thin-film-transistor M1, a turn-on duration of the first thin-film-transistor M1 is made to be T1, and then the first thin-film-transistor M1 transmits the data signal Dm with the duration T1 to the first drive unit 1; and similarly, the control unit 4 transmits the switching circuit signal LC with the duration T1 to the second thin-film-transistor M2, a turn-on duration of the second thin-film-transistor M2 is made to be T1, and then the second thin-film-transistor M2 transmits the data signal Dm with the duration T1 to the second drive unit 2. When the light-emitting brightness of the first display unit 5 is higher than the light-emitting brightness of the second display unit 6, at an $N^{th}$ frame, the control unit 4 transmits the switching circuit signal LC with a duration T2 to the first thin-film-transistor M1, the turn-on duration of the first thin-film-transistor M1 is made to be T2, and then the first thin-film-transistor M1 transmits the data signal Dm with the duration T2 to the first drive unit 1, wherein T2 is smaller than T1; when at an $(N+1)^{th}$ frame, the control unit 4 transmits the switching circuit signal LC with the duration T1 to the second thin-film-transistor M2, the turn-on duration of the second thin-film-transistor M2 is made to be T1, and then the second thin-film-transistor M2 transmits the data signal Dm with the duration T1 to the second drive unit; and when at an $(N+2)^{th}$ frame, the control unit 4 transmits the switching circuit signal LC with the duration T2 to the first thin-film-transistor M1, the turn-on duration of the first thin-film-transistor M1 is made to be T2, and then the first thin-film-transistor M1 transmits the data signal with the duration T2 to the first drive unit 1 . . . , and so on, so that the duration of the data signal Dm corresponding to the first display unit 5 is shortened, and the display effects of the first display unit 5 and the second display unit 6 tend to be the same.

In some examples of this embodiment, the first display detection circuit 31 includes: a first photoresistor, a first end of the first photoresistor is connected with a control end of the first drive unit 1, and a second end of the first photoresistor is connected with the control unit 4, and further connected with a grounding resistor; and the second display detection circuit includes: a second photoresistor, a first end of the second photoresistor is connected with a control end of the second drive unit 2, and a second end of the second photoresistor is connected with the control unit 4, and further connected with a grounding resistor. A resistance value of the first photoresistor changes with the brightness of the first display unit 5, and a resistance value of the second photoresistor changes with the brightness of the second display unit 6; specifically, if the brightness of the first display unit 5 is reduced, the resistance value of the first photoresistor is increased, and if the brightness of the first display unit 5 is increased, the resistance value of the first photoresistor is reduced; and if the brightness of the second display unit 6 is reduced, the resistance value of the second photoresistor is increased, and if the brightness of the second display unit 6 is increased, the resistance value of the second photoresistor is reduced.

The first end of the first photoresistor is connected with the control end of the first drive unit 1, when the control end of the first drive unit 1 receives the data signal Dm, the first end of the first photoresistor also receives the data signal Dm, then a voltage of the second end of the first photoresistor changes with the resistance value of the first photoresistor, the brightness of the first display unit 5 is reduced, then the resistance value of the first photoresistor is increased, and then a voltage value of the second end of the first photoresistor is also reduced; if the brightness of the first display unit 5 is increased, the resistance value of the first photoresistor is reduced, and then the voltage value of the second end of the first photoresistor is also increased; similarly, a voltage of the second end of the second photoresistor also changes with the brightness of the second display unit 6; and the control unit 4 is connected with the second end of the first photoresistor and the second end of the second photoresistor respectively, so as to determine the light-emitting brightness of the first display unit 5 and the second display unit 6.

In some examples of this embodiment, the display drive circuit further includes: a first compensation unit and a second compensation unit, wherein a first end of the first compensation unit is connected with the control end of the first drive unit 1, and a constant current source Ics is connected into a second end of the first compensation unit; and a first end of the second compensation unit is connected with the control end of the second drive unit 2, and the constant current source Ics is connected into a second end of the second compensation unit.

In some examples of this embodiment, the first drive unit 1 includes: a third thin-film-transistor, the control unit 4 is connected into a control end of the third thin-film-transistor, the constant current source Ics is connected into an input end of the third thin-film-transistor, and the first display unit 5 is connected into an output end of the third thin-film-transistor. The second drive unit 2 includes: a fourth thin-film-transistor, the control unit 4 is connected into a control end of the fourth thin-film-transistor, the constant current source Ics is connected into an input end of the fourth thin-film-transistor, and the second display unit 6 is connected into an output end of the fourth thin-film-transistor. When the third thin-film-transistor receives the data signal Dm, the third thin-film-transistor is turned on according to the data signal Dm, and drives the first display unit 5 to emit light according to the constant current source Ics; and when the fourth thin-film-transistor receives the data signal Dm, the fourth thin-film-transistor is turned on according to the data signal Dm, and drives the second display unit 6 to emit light according to the constant current source Ics.

The display drive circuit provided by this embodiment includes: the first drive unit, the second drive unit, the display detection unit and the control unit. The control unit is connected with the first drive unit and the second drive unit respectively, and used for sending the data signal to the first drive unit and the second drive unit alternately; the first drive unit is connected with the first display unit, and used for driving the first display unit to emit light according to the data signal; the second drive unit is connected with the second display unit, and used for driving the second display unit to emit light according to the data signal; the display detection unit is connected with the control unit, and used for detecting the light-emitting brightness of the first display unit and the second display unit, and transmitting the light-emitting brightness of the first display unit and the second display unit to the control unit, and the control unit is used for adjusting the enabling time of the first drive unit and the second drive unit according to the received light-emitting brightness. When the first drive unit is enabled, the second drive unit is not enabled, when the second drive unit is enabled, the first drive unit is not enabled, when the first drive unit is enabled, the first display unit is driven to emit light, and when the second drive unit is enabled, the second display unit is driven to emit light, which achieves that within any period of time, there is only one of the first drive unit and the second drive unit being in the enabled state, thereby achieving alternate display of the first display unit and the second display unit, reducing the display duration of the first display unit and the second display unit, and avoiding the problem that the first display unit or the second display unit emits light for displaying for a long time, so that the service lives of the first display unit and the second display unit are effectively prolonged. At the same time, the enabling time of the first drive unit and the second drive unit is adjusted based on the light-emitting brightness of the first display unit and the light-emitting brightness of the second display unit which are detected by the display detection unit, which further effectively prolongs the service lives of the first display unit and the second display unit, and makes the display effects of the first drive unit and the second drive unit tend to be the same, improving the display effects.

Another Embodiment

Figure 4:
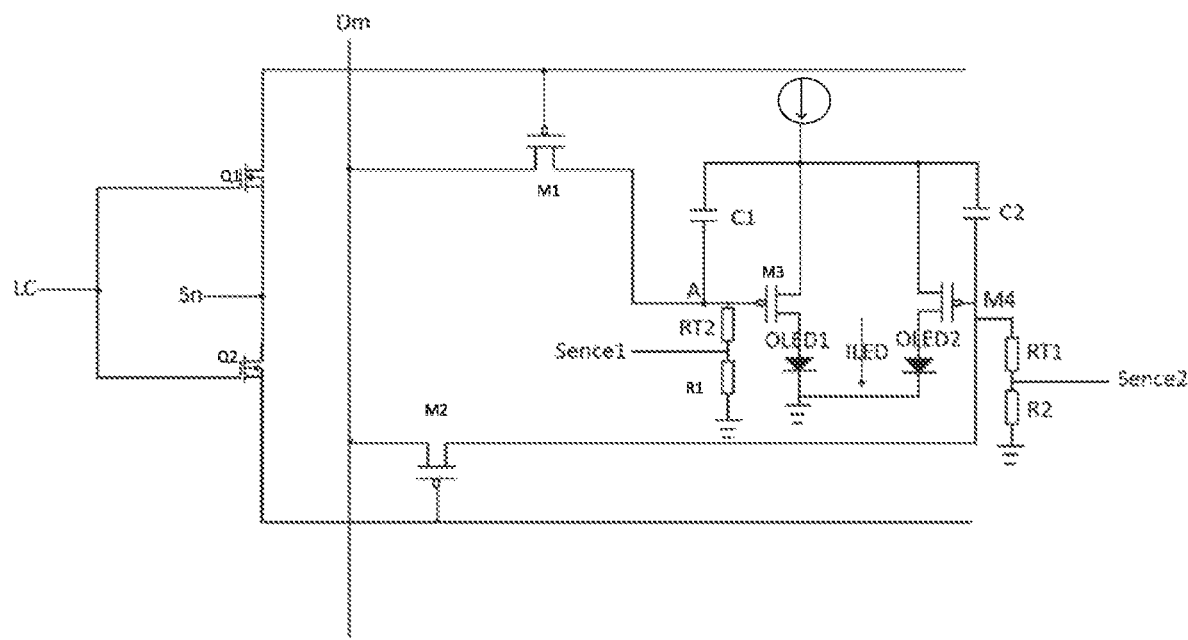
FIG. 4 is a basic schematic structural diagram of a display drive circuit provided by another embodiment of the present application.

In order to better understand the present disclosure, this embodiment provides more specific examples for illustration. This example provides a display drive circuit, as shown in FIG. 4, wherein LC is a switching circuit signal, Q1 and Q2 are switches for controlling two parts of the circuit, Sn is a scanning signal, RT1 and RT2 are photoresistors, and sence1 and sence2 are electrical signals converted from light-emitting brightness outputted by a first display detection circuit and a second display detection circuit respectively. The first display detection circuit includes the photoresistor RT2 and a grounding resistor R1, and the second display detection circuit includes the photoresistor RT1 and a grounding resistor R2. A first drive unit is composed of a thin-film-transistor M3, and a second drive unit is composed of a thin-film-transistor M4.

An OLED1 and an OLED2 have the same aging degree and similar processes at the beginning. When the LC is at time t1, it is at a high level, at this time, the Q1 is switched on, the M1 is switched on by the scanning signal Sn, a C1 is charged by a Dm, at the same time, an M1 is switched on, an Ics provides currents for the OLED1, and the OLED2 does not work temporarily due to the cutoff of the Q2.

When at a moment t2, the Q2 is switched on, the scanning signal is given to an M2, the M2 is turned on, a C2 is charged by the Dm, the M4 is switched on, the Ics provides currents for the OLED2, at this time, the OLED2 works, and the OLED1 rests. However, due to differences in processes, the two OLED lamps have different aging degrees and light-emitting efficiency after a certain period of time, and at this time, if the intensity of cross working is further divided, it will make the worse one even worse.

Therefore, the first display detection circuit and the second display detection circuit are provided to detect the brightness of the two OLED lamps when the M1 and the M4 are switched on and charged, and feed back the brightness to the control unit, by comparing the brightness of the two OLED lamps, as shown in FIG. 5, light-emitting time is adjusted to be LC', and thus the service lives and aging degrees of the two lamps are similar. For this mode, one group of OLED circuits may work while the other group rests within one cycle, and the mode of cross working may prevent the working temperature of the OLED lamps and the transistors from maintaining a very high temperature all the time, avoid them from being in a high-temperature aging state all the time, and also adjust aging differences caused by the processes.

Another Embodiment

Figure 6:
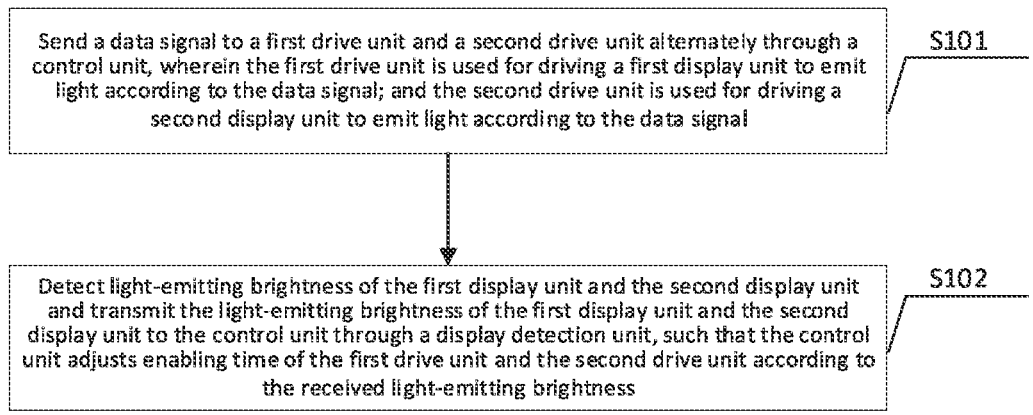
FIG. 6 is a basic schematic diagram of a display drive method provided by another embodiment of the present application.

Based on the same concept, this embodiment provides a display drive method, and as shown in FIG. 6, the display drive method includes:

S101, a data signal is sent to a first drive unit and a second drive unit alternately through a control unit, wherein the first drive unit is used for driving a first display unit to emit light according to the data signal, and the second drive unit is used for driving a second display unit to emit light according to the data signal; and S102, light-emitting brightness of the first display unit and the second display unit are detected and the light-emitting brightness of the first display unit and the second display unit is transmitted to the control unit through a display detection unit, such that the control unit adjusts enabling time of the first drive unit and the second drive unit according to the received light-emitting brightness.

In some examples of this embodiment, adjusting the enabling time of the first drive unit and the second drive unit according to the received light-emitting brightness, includes: in a case that the light-emitting brightness of the first display unit is higher than the light-emitting brightness of the second display unit, an alternating cycle of the control unit sending the data signal is modified, such that a light-emitting cycle of the first display unit is longer than a light-emitting cycle of the second display unit; and in a case that the light-emitting brightness of the first display unit is lower than the light-emitting brightness of the second display unit, an alternating cycle of the control unit sending the data signal is modified, such that a light-emitting cycle of the second display unit is longer than a light-emitting cycle of the first display unit.

Continuing from the above example, after the display detection unit detects the light-emitting brightness of the first display unit and the second display unit and transmits the light-emitting brightness of the first display unit and the second display unit to the control unit, the control unit can further modify the alternating cycle of the data signal, so that the light-emitting efficiency of the first display unit and the second display unit tends to be consistent. Specifically, if when the control unit sends the data signal alternately with a current alternating cycle, the light-emitting brightness of the first display unit is greater than the light-emitting brightness of the second display unit, at this time, the light-emitting cycle of the second display unit may be shortened, and the light-emitting cycle of the first display unit may be prolonged. For example, the control unit sends the data signal alternately to the first drive unit and the second drive unit with one frame as the alternating cycle, the light-emitting brightness of the first display unit is greater than the light-emitting brightness of the second display unit, and the control unit modifies the alternating cycle to be "successively sending the data signal twice to the first drive unit, and then switching to send the data signal once to the second drive unit". Specifically, when at an $N^{th}$ frame, the control unit sends the data signal to the first drive unit, then the first drive unit is enabled at the $N^{th}$ frame, and the second drive unit does not receive the data signal and is not enabled; the control unit sends the data signal to the first drive unit at an $(N+1)^{th}$ frame, then the first drive unit is enabled at the $(N+1)^{th}$ frame, and the second drive unit does not receive the data signal and is not enabled; the control unit sends the data signal to the second drive unit at an $(N+2)^{th}$ frame, then the second drive unit is enabled at the $(N+2)^{th}$ frame, and the first drive unit does not receive the data signal and is not enabled; and the control unit sends the data signal to the first drive unit at an $(N+3)^{th}$ frame, then the first drive unit is enabled at the $(N+3)^{th}$ frame, and the second drive unit does not receive the data signal and is not enabled . . . , and so on, so that the light-emitting cycle of the first display unit is made to be longer than the light-emitting cycle of the second display unit, and an enabling duration of the first display unit is made to be longer than an enabling duration of the second display unit, thereby increasing an aging speed of the first display unit, and thus the aging degrees of the first display unit and the second display unit tend to be consistent.

In some examples of this embodiment, adjusting the enabling time of the first drive unit and the second drive unit according to the received light-emitting brightness, further includes: if the light-emitting brightness of the first display unit is higher than the light-emitting brightness of the second display unit, the data signal is adjusted, such that the enabling time of the first drive unit is shorter than the enabling time of the second drive unit; and if the light-emitting brightness of the first display unit is lower than the light-emitting brightness of the second display unit, the data signal is adjusted, such that the enabling time of the first drive unit is longer than the enabling time of the second drive unit. The enabling time of the first drive unit and/or the second drive unit is adjusted to adjust a duty cycle of the first drive unit and/or the second drive unit. It can be understood that the light-emitting brightness of the display units may be adjusted by adjusting the duty cycle, specifically, the higher the duty cycle, the higher the brightness of the display units, while the lower the duty cycle, the lower the brightness of the display units.

Continuing from the above example, in order to make the light-emitting brightness of the first display unit and the brightness of the second display unit tend to be consistent, the data signal corresponding to the first drive unit and/or the second drive unit may be adjusted to adjust the enabling time of the first drive unit and/or the second drive unit, so that the effect of adjusting the duty cycle corresponding to the first display unit and/or the second display unit is achieved, and thus the light-emitting brightness of the first display unit and the brightness of the second display unit tend to be consistent. Specifically, if the light-emitting brightness of the first display unit is higher than the light-emitting brightness of the second display unit, the enabling time of the second drive unit is prolonged by adjusting the data signal, so as to increase the duty cycle of the second display unit, the light-emitting brightness of the second display unit is enhanced, the original enabling time of the first drive unit is maintained, and the duty cycle of the first display unit is maintained, so that the light-emitting brightness of the second display unit and the light-emitting brightness of the first display unit tend to be consistent. Similarly, if the light-emitting brightness of the first display unit is lower than the light-emitting brightness of the second display unit, the data signal is adjusted to prolong the enabling time of the first drive unit, so as to increase the duty cycle of the first display unit, the light-emitting brightness of the first display unit is enhanced, the original enabling time of the second drive unit is maintained, and the duty cycle of the second display unit is maintained, so that the light-emitting brightness of the second display unit and the light-emitting brightness of the first display unit tend to be consistent.

The above display drive method is applied to the above display drive circuit, and the display drive circuit includes: a first drive unit, a second drive unit, a display detection unit and a control unit. The control unit is connected with the first drive unit and the second drive unit respectively, and used for sending a data signal to the first drive unit and the second drive unit alternately; the first drive unit is connected with a first display unit, and used for driving the first display unit to emit light according to the data signal; the second drive unit is connected with a second display unit, and used for driving the second display unit to emit light according to the data signal; the display detection unit is connected with the control unit, and used for detecting light-emitting brightness of the first display unit and the second display unit, and transmitting the light-emitting brightness of the first display unit and the second display unit to the control unit, and the control unit is used for adjusting the enabling time of the first drive unit and the second drive unit according to the received light-emitting brightness.

The control unit includes: a first thin-film-transistor, a second thin-film-transistor and a control switch; the data signal is connected into an input end of the first thin-film-transistor, the first drive unit is connected into an output end of the first thin-film-transistor, and the control switch is connected into a control end of the first thin-film-transistor; and the data signal is connected into an input end of the second thin-film-transistor, the second drive unit is connected into an output end of the second thin-film-transistor, and the control switch is connected into a control end of the second thin-film-transistor.

The control switch includes: a first control switch and a second control switch, the first control switch is turned on when receiving a first polarity signal, the second control switch is turned on when receiving a second polarity signal, and the first polarity signal and the second polarity signal are opposite-polarity signals; a switching circuit signal is connected into a control end of the first control switch, a scanning signal is connected into an input end of the first control switch, and an output end of the first control switch is connected with the control end of the first thin-film-transistor; and the switching circuit signal is connected into a control end of the second control switch, the scanning signal is connected into an input end of the second control switch, and an output end of the second control switch is connected with the control end of the second thin-film-transistor.

The display detection unit includes: a first display detection circuit and a second display detection circuit, and the first display detection circuit and the second display detection circuit are connected with the control unit respectively; the first display detection circuit is used for detecting the light-emitting brightness of the first display unit, and the second display detection circuit is used for detecting the light-emitting brightness of the second display unit; and the control unit is used for adjusting the switching circuit signal according to the light-emitting brightness of the first display unit and the light-emitting brightness of the second display unit.

The first display detection circuit includes: a first photo-resistor, a first end of the first photoresistor is connected with a control end of the first drive unit, and a second end of the first photoresistor is connected with the control unit, and further connected with a grounding resistor; and the second display detection circuit includes: a second photoresistor, a first end of the second photoresistor is connected with a control end of the second drive unit, and a second end of the second photoresistor is connected with the control unit, and further connected with a grounding resistor.

The display drive circuit further includes: a first compensation unit and a second compensation unit, wherein, a first end of the first compensation unit is connected with the control end of the first drive unit, and a constant current source is connected into a second end of the first compensation unit; and a first end of the second compensation unit is connected with the control end of the second drive unit, and the constant current source is connected into a second end of the second compensation unit.

The first drive unit includes: a third thin-film-transistor, the control unit is connected into a control end of the third thin-film-transistor, a constant current source is connected into an input end of the third thin-film-transistor, and the first display unit is connected into an output end of the third thin-film-transistor; and the second drive unit includes: a fourth thin-film-transistor, the control unit is connected into a control end of the fourth thin-film-transistor, the constant current source is connected into an input end of the fourth thin-film-transistor, and the second display unit is connected into an output end of the fourth thin-film-transistor.

Another Embodiment

Figure 7:
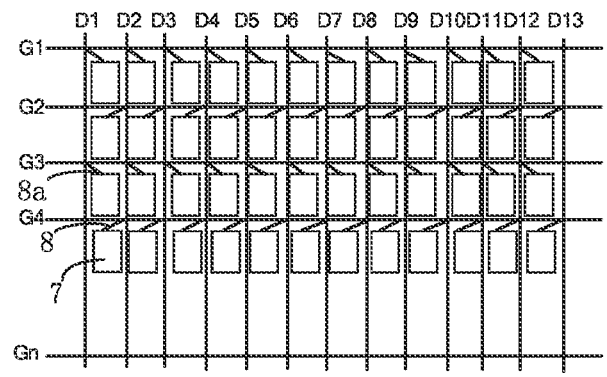
FIG. 7 is a basic schematic structural diagram of a display panel provided by another embodiment of the present application.
Figure 8:
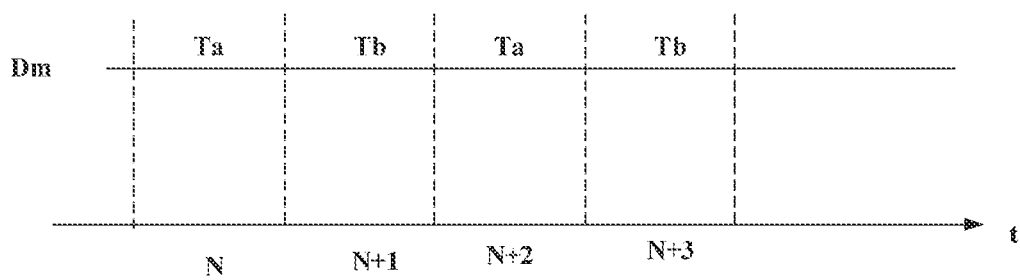
FIG. 8 is a basic schematic diagram of timing of each signal in another optional display drive circuit provided by another embodiment of the present application.

Based on the same concept, this embodiment provides a display panel, as shown in FIG. 7, the display panel includes a plurality of pixels 7 arranged in an array, each pixel 7 is connected with a corresponding drive circuit 8a, and at least part of the drive circuits is a display drive circuit 8. The display drive circuit 8 includes: a first drive unit, a second drive unit, a display detection unit and a control unit; wherein the control unit is connected with the first drive unit and the second drive unit respectively, and used for sending a data signal to the first drive unit and the second drive unit alternately; the first drive unit is connected with a first display unit, and used for driving the first display unit to emit light according to the data signal; the second drive unit is connected with a second display unit, and used for driving the second display unit to emit light according to the data signal; and the display detection unit is connected with the control unit, and used for detecting light-emitting brightness of the first display unit and the second display unit, and transmitting the light-emitting brightness of the first display unit and the second display unit to the control unit, and the control unit is used for adjusting enabling time of the first drive unit and the second drive unit according to the received light-emitting brightness.

It also needs be noted that the terms "comprise", "include", or any other variants thereof are intended to cover non-exclusive inclusions, so that a process, method, commodity, or device that includes a series of elements not only includes those elements, but also other elements that are not explicitly listed, or also includes elements inherent in such a process, method, commodity, or device. Without further restrictions, the elements defined by the statement "including one . . . " do not exclude that there are other identical elements in the process, method, commodity or device including the elements.

The above are only the embodiments of the present application and are not intended to limit the present application. For those skilled in the art, the present application may have various modifications and changes. Any modifications, equivalent substitutions, improvements, etc. made within the spirit and principles of the present application shall be included within the scope of the claims of the present application.

What is claimed is:

1. A display drive circuit, comprising: a first drive unit, a second drive unit, a display detection unit and a control unit; wherein,
  the control unit is connected with the first drive unit and the second drive unit respectively, and used for sending a data signal to the first drive unit and the second drive unit alternately;
  the first drive unit is connected with a first display unit, and used for driving the first display unit to emit light according to the data signal; the second drive unit is connected with a second display unit, and used for driving the second display unit to emit light according to the data signal; and
  the display detection unit is connected with the control unit, and used for detecting a first light-emitting brightness of the first display unit and a second light-emitting brightness of the second display unit, and transmitting the first light-emitting brightness of the first display unit and the second light-emitting brightness of the second display unit to the control unit, and the control unit is configured to adjust a first enabling time of the first drive unit according to the received first light-emitting brightness and a second enabling time of the second drive unit according to the second received light-emitting brightness;

wherein the control unit comprises: a first thin-film-transistor, a second thin-film-transistor and a control switch;

a data line of the data signal is connected to an input end of the first thin-film-transistor, the first drive unit is connected to an output end of the first thin-film-transistor, and the control switch is connected to a control end of the first thin-film-transistor; and the data line of the data signal is connected to an input end of the second thin-film-transistor, the second drive unit is connected to an output end of the second thin-film-transistor, and the control switch is connected to a control end of the second thin-film-transistor;

wherein the control switch comprises: a first control switch and a second control switch, the first control switch is turned on when receiving a first polarity signal, the second control switch is turned on when receiving a second polarity signal, and the first polarity signal and the second polarity signal are opposite-polarity signals; wherein a switching circuit signal line of a switching circuit signal is connected to a control end of the first control switch, a scanning signal line of a scanning signal is connected to an input end of the first control switch, and an output end of the first control switch is connected with the control end of the first thin-film-transistor; and the switching circuit signal line is connected to a control end of the second control switch, the scanning signal line is connected to an input end of the second control switch, and an output end of the second control switch is connected with the control end of the second thin-film-transistor-.

2. The display drive circuit of claim 1, wherein the display detection unit comprises: a first display detection circuit and a second display detection circuit, and the first display detection circuit and the second display detection circuit are connected with the control unit respectively;

the first display detection circuit is used for detecting the first light-emitting brightness of the first display unit, and the second display detection circuit is used for detecting the second light-emitting brightness of the second display unit; and the control unit is used for adjusting the switching circuit signal according to the first light-emitting brightness of the first display unit and the second light-emitting brightness of the second display unit.

3. The display drive circuit of claim 2, wherein the first display detection circuit comprises: a first photoresistor, a first end of the first photoresistor is connected with a control end of the first drive unit, and a second end of the first photoresistor is connected with the control unit, and further connected with a grounding resistor.

4. The display drive circuit of claim 2, wherein the second display detection circuit comprises: a second photoresistor, a first end of the second photoresistor is connected with a control end of the second drive unit, and a second end of the second photoresistor is connected with the control unit, and further connected with a grounding resistor.

5. The display drive circuit of claim 1, further comprising: a first compensation unit and a second compensation unit, wherein, a first end of the first compensation unit is connected with a control end of the first drive unit, and a constant current source is connected to a second end of the first compensation unit; and a first end of the second compensation unit is connected with a control end of the second drive unit, and the constant current source is connected a second end of the second compensation unit.

6. The display drive circuit of claim 1, wherein the first drive unit comprises: a third thin-film-transistor, the control unit is connected to a control end of the third thin-film-transistor, a constant current source is connected to an input end of the third thin-film-transistor, and the first display unit is connected to an output end of the third thin-film-transistor.

7. The display drive circuit of claim 1, wherein the second drive unit comprises: a fourth thin-film-transistor, the control unit is connected to a control end of the fourth thin-film-transistor, a constant current source is connected to an input end of the fourth thin-film-transistor, and the second display unit is connected to an output end of the fourth thin-film-transistor.

8. A display drive method, applied to a display drive circuit, the display drive circuit comprising: a first drive unit, a second drive unit, a display detection unit and a control unit; wherein the control unit is connected with the first drive unit and the second drive unit respectively, and used for sending a data signal to the first drive unit and the second drive unit alternately; the first drive unit is connected with a first display unit, and used for driving the first display unit to emit light according to the data signal; the second drive unit is connected with a second display unit, and used for driving the second display unit to emit light according to the data signal; the display detection unit is connected with the control unit, and used for detecting a first light-emitting brightness of the first display unit and a second light-emitting brightness of the second display unit, and transmitting the first light-emitting brightness of the first display unit and the second light-emitting brightness of the second display unit to the control unit, and the control unit is configured to adjust a first enabling time of the first drive unit according to the received first light-emitting brightness and a second enabling time of the second drive unit according to the received second light-emitting brightness; and the display drive method comprises:

sending the data signal to the first drive unit and the second drive unit alternately through the control unit, wherein the first drive unit is used for driving the first display unit to emit light according to the data signal, and the second drive unit is used for driving the second display unit to emit light according to the data signal; and detecting the first light-emitting brightness of the first display unit and the second light-emitting brightness of the second display unit through the display detection unit, and transmitting the first light-emitting brightness of the first display unit and the second light-emitting brightness of the second display unit to the control unit, such that the control unit is configured to adjusts the first enabling time of the first drive unit according to the received first light-emitting brightness and the second enabling time of the second drive unit according to the received second light-emitting brightness;

wherein adjusting the first enabling time of the first drive unit according to the received first light-emitting brightness and the second enabling time of the second drive unit according to the received second light-emitting brightness comprises:

modifying, in a case that the first light-emitting brightness of the first display unit is higher than the second light-emitting brightness of the second display unit, an alternating cycle of the data signal sending the data signal to the control unit, such that a light-emitting cycle of the first display unit is longer than a light-emitting cycle of the second display unit.

9. The display drive method of claim 8, wherein adjusting the first enabling time of the first drive unit according to the received first light-emitting brightness and the second enabling time of the second drive unit according to the received second light-emitting brightness comprises:

modifying, in a case that the first light-emitting brightness of the first display unit is lower than the second light-emitting brightness of the second display unit, an alternating cycle of the data signal sending the data signal to the control unit, such that a light-emitting cycle of the second display unit is longer than a light-emitting cycle of the first display unit.

10. The display drive method of claim 8, wherein adjusting the first enabling time of the first drive unit according to the received first light-emitting brightness and the second enabling time of the second drive unit according to the received second light-emitting brightness comprises:

adjusting, in a case that the first light-emitting brightness of the first display unit is higher than the second light-emitting brightness of the second display unit, the data signal, such that the first enabling time of the first drive unit is shorter than the second enabling time of the second drive unit.

11. The display drive method of claim 8, wherein adjusting the first enabling time of the first drive unit according to the received first light-emitting brightness and the second enabling time of the second drive unit according to the received second light-emitting brightness comprises:

adjusting, in a case that the first light-emitting brightness of the first display unit is lower than the second light-emitting brightness of the second display unit, the data signal, such that the first enabling time of the first drive unit is longer than the second enabling time of the second drive unit.

12. A display panel, comprising a plurality of pixels arranged in an array, each pixel being connected with a corresponding drive circuit, and at least part of the drive circuits being a display drive circuit, wherein the display drive circuit comprises: a first drive unit, a second drive unit, a display detection unit and a control unit; wherein the control unit is connected with the first drive unit and the second drive unit respectively, and used for sending a data signal to the first drive unit and the second drive unit alternately; the first drive unit is connected with a first display unit, and used for driving the first display unit to emit light according to the data signal; the second drive unit is connected with a second display unit, and used for driving the second display unit to emit light according to the data signal; and the display detection unit is connected with the control unit, and used for detecting a first light-emitting brightness of the first display unit and a second light-emitting brightness of the second display unit, and transmitting the first light-emitting brightness of the first display unit and the second light-emitting brightness of the second display unit to the control unit, and the control unit is used for adjusting a first enabling time of the first drive unit according to the received first light-emitting brightness and a second enabling time of the second drive unit according to the received second light-emitting brightness;

wherein the control unit comprises: a first thin-film-transistor, a second thin-film-transistor and a control switch;

a data line of the data signal is connected to an input end of the first thin-film-transistor, the first drive unit is connected to an output end of the first thin-film-transistor, and the control switch is connected to a control end of the first thin-film-transistor; and the data line of the data signal is connected to an input end of the second thin-film-transistor, the second drive unit is connected to an output end of the second thin-film-transistor, and the control switch is connected to a control end of the second thin-film-transistor;

wherein the control switch comprises: a first control switch and a second control switch, the first control switch is turned on when receiving a first polarity signal, the second control switch is turned on when receiving a second polarity signal, and the first polarity signal and the second polarity signal are opposite-polarity signals; wherein a switching circuit signal line of a switching circuit signal is connected to a control end of the first control switch, a scanning signal line of a scanning signal is connected to an input end of the first control switch, and an output end of the first control switch is connected with the control end of the first thin-film-transistor; and the switching circuit signal line is connected to a control end of the second control switch, the scanning signal line is connected to an input end of the second control switch, and an output end of the second control switch is connected with the control end of the second thin-film-transistor.

* * * * *